(12) United States Patent
Vandermeijden

(10) Patent No.: US 11,494,023 B2
(45) Date of Patent: Nov. 8, 2022

(54) USING ELECTRICAL RESISTANCE TO ESTIMATE FORCE ON AN ELECTRODE DURING TEMPERATURE CHANGES

(71) Applicant: Synaptics Incorporated, San Jose, CA (US)

(72) Inventor: Tom Vandermeijden, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 17/235,190

(22) Filed: Apr. 20, 2021

(65) Prior Publication Data

US 2021/0240324 A1    Aug. 5, 2021

Related U.S. Application Data

(63) Continuation of application No. 16/395,508, filed on Apr. 26, 2019, now Pat. No. 11,009,988.

(60) Provisional application No. 62/667,418, filed on May 4, 2018.

(51) Int. Cl.
    *G06F 3/041*     (2006.01)
    *G06F 3/044*     (2006.01)
    *G06F 3/045*     (2006.01)
    *G01R 27/14*     (2006.01)

(52) U.S. Cl.
CPC ......... *G06F 3/04146* (2019.05); *G01R 27/14* (2013.01); *G06F 3/045* (2013.01); *G06F 3/0412* (2013.01); *G06F 3/0414* (2013.01); *G06F 3/0443* (2019.05); *G06F 3/0446* (2019.05); *G06F 3/04144* (2019.05)

(58) Field of Classification Search
CPC ............................ G06F 3/0414–04146; G06F 3/04166–041662; G06F 3/0418–04186; G06F 3/0412; G06F 3/045; G06F 3/047; G06F 3/044; G06F 3/0443–0448; G06F 2203/04105; G06F 2203/04106; G01R 26/14; G01R 26/02
See application file for complete search history.

(56) References Cited

U.S. PATENT DOCUMENTS

| 8,026,906 | B2 * | 9/2011 | Molne | G06F 3/0414 |
| | | | | 345/174 |
| 2007/0024595 | A1 * | 2/2007 | Baker | G06F 3/0485 |
| | | | | 345/173 |
| 2016/0048266 | A1 | 2/2016 | Smith et al. | |

(Continued)

*Primary Examiner* — David Tung
(74) *Attorney, Agent, or Firm* — Ferguson Braswell Fraser Kubasta PC

(57) ABSTRACT

A processing system includes sensor circuitry and processing circuitry. The sensor circuitry is configured to, using the sensor electrodes, obtain capacitive measurements of a sensing region, and obtain a resistance measurement of the sensing region. The processing circuitry is coupled to the sensor circuitry. The processing circuitry is configured to determine a location of an input object using the capacitive measurements of the sensing region; and determine a force value based on the resistance measurement and the location of the input object. Determining the force value mitigates a temperature variation of the sensing region affecting the resistance measurement. The processing circuitry is further configured to report the force value.

4 Claims, 14 Drawing Sheets

(56) References Cited

U.S. PATENT DOCUMENTS

| | | | |
|---|---|---|---|
| 2016/0103545 A1* | 4/2016 | Filiz | G06F 3/0418 |
| | | | 345/174 |
| 2016/0342257 A1* | 11/2016 | Watazu | G06F 3/0445 |
| 2017/0052074 A1 | 2/2017 | Watazu et al. | |
| 2017/0184461 A1* | 6/2017 | Chi | G06F 3/0418 |
| 2017/0242539 A1* | 8/2017 | Mani | G06F 3/0445 |
| 2017/0308221 A1 | 10/2017 | Li et al. | |
| 2018/0074638 A1 | 3/2018 | Chiang et al. | |

* cited by examiner

USING ELECTRICAL RESISTANCE TO ESTIMATE FORCE ON AN ELECTRODE DURING TEMPERATURE CHANGES

CROSS-REFERENCE TO RELATED APPLICATIONS

This application claims benefit under 35 U.S.C. § 120 as a continuation of U.S. patent application Ser. No. 16/395,508 filed on Apr. 26, 2019 and entitled, "USING ELECTRICAL RESISTANCE TO ESTIMATE FORCE ON AN ELECTRODE DURING TEMPERATURE CHANGES." U.S. patent application Ser. No. 16/395,508 claims benefit under 35 U.S.C. § 119(e) as a non-provisional of U.S. Provisional Application No. 62/667,418 filed on May 4, 2018 and entitled, "INTEGRATED CLEAR FORCE TEMPERATURE MITIGATION." U.S. patent application Ser. No. 16/395,508 and Provisional Application No. 62/667,418 are incorporated herein by reference in their entirety.

BACKGROUND

In electronics, the electrical resistance of an object may vary with changes in temperature of the object. While this physical fact can have useful applications, such as the ability to design a thermometer using an electrical circuit, the changes in resistance due to changes in temperature can create technological challenges in certain other areas in the art of electronics.

SUMMARY

In general, in one aspect, embodiments are related to a processing system includes sensor circuitry and processing circuitry. The sensor circuitry is configured to, using the sensor electrodes, obtain capacitive measurements of a sensing region, and obtain a resistance measurement of the sensing region. The processing circuitry is coupled to the sensor circuitry. The processing circuitry is configured to determine a location of an input object using the capacitive measurements of the sensing region; and determine a force value based on the resistance measurement and the location of the input object. Determining the force value mitigates a temperature variation of the sensing region affecting the resistance measurement. The processing circuitry is further configured to report the force value.

In another aspect, embodiments also relate to an input device. The input device includes sensor electrodes and a processing system. The processing system is configured to obtain capacitive measurements of a sensing region, determine a location of an input object using the capacitive measurements, obtain a resistance measurement of the sensing region, and determine a force value based on the resistance measurement and the location of the input object. Determining the force value mitigates a temperature variation of the sensing region affecting the resistance measurement. The processing system is further configured to report the force value.

In another aspect, embodiments relate to a method. The method includes obtaining capacitive measurements of a sensing region, determining a location of an input object using the capacitive measurements, obtaining a resistance measurement of the sensing region, and determining a force value based on the resistance measurement and the location of the input object. Determining the force value mitigates a temperature variation of the sensing region affecting the resistance measurement. The method further includes reporting the force value.

Other aspects of the invention will be apparent from the following description and the appended claims.

DETAILED DESCRIPTION

Figure 1:
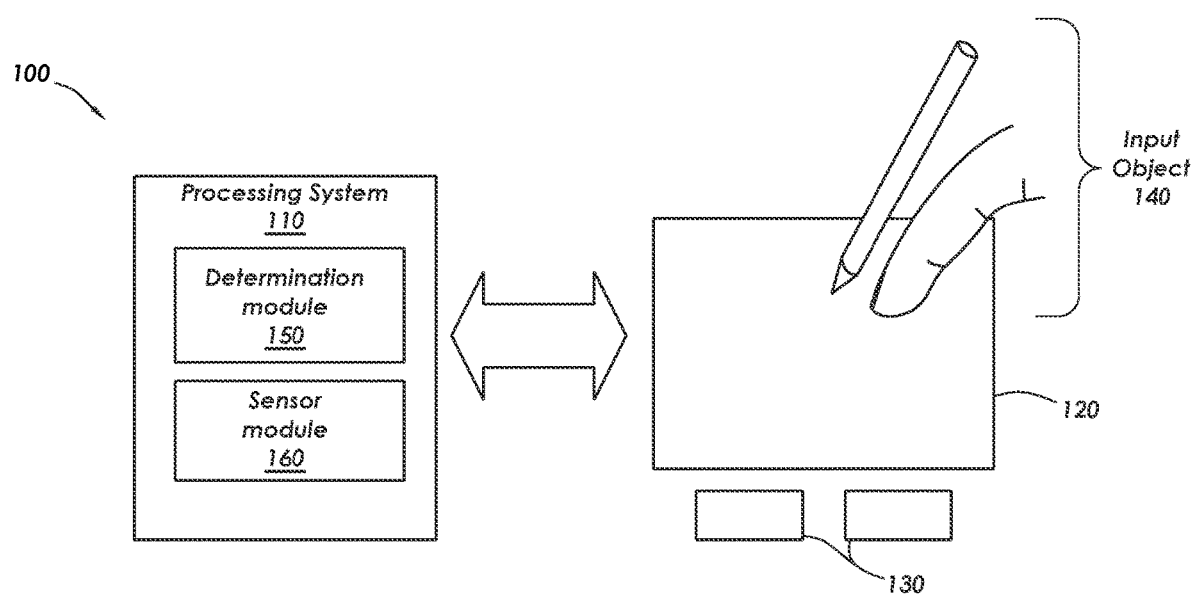
FIG. 1 shows a system diagram in accordance with disclosed embodiments.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Further, although the description includes a discussion of various embodiments of the invention, the various disclosed embodiments may be combined in virtually any manner. All combinations are contemplated herein.

Force applied by a finger may be estimated from strain on electrodes as measured by change in resistance. The measured resistance may also change with temperature. In one or more embodiments, force is estimated across varying temperature. For example, one or more embodiments may be applicable to ITO (Indium Tin Oxide) or metal mesh. A change in electrical resistance of an electrical component may be used to estimate force on a surface of an input device, such as a mobile phone, tablet, or other computing device. For example, force applied by a finger may be estimated from strain on electrodes by measuring changes in resistance. Changes in temperature may affect the electrical resistance values of the electrical components being measured. Thus, changes in temperature, which could be caused by heat from the user's fingers, can hinder an accurate calculation of the force being applied to the surface of the input device. One or more embodiments describes techniques to estimate force across varying temperature.

Turning now to the figures, FIG. 1 shows a block diagram of an exemplary input device (100), in accordance with embodiments of the disclosure. The input device (100) may be configured to provide input to an electronic system (not shown for simplicity). As used in this document, the term "electronic system" (or "electronic device") broadly refers to any system capable of electronically processing information. Examples of electronic systems may include personal computers of all sizes and shapes (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). Additionally, the electronic system could be a host or a slave to the input device.

The input device (100) may be implemented as a physical part of the electronic system. In the alternative, the input device (100) may be physically separate from the electronic system. The input device (100) may be coupled to (and communicate with) components of the electronic system using various wired or wireless interconnections and communication technologies, such as buses and networks. Example technologies may include Inter-Integrated Circuit (I2C), Serial Peripheral Interface (SPI), PS/2, Universal Serial Bus (USB), Bluetooth®, Infrared Data Association (IrDA), and various radio frequency (RF) communication protocols defined by the IEEE 802.11 or other standards.

In the example of FIG. 1, the input device (100) may correspond to a proximity sensor device (such as a "touchpad" or a "touch sensor device") configured to sense input provided by one or more input objects (140) in a sensing region (120). Example input objects include fingers and styli. The sensing region (120) may encompass any space above, around, in and/or near the input device (100) in which the input device (100) is able to detect user input (e.g., provided by one or more input objects (140)). The sizes, shapes, and locations of particular sensing regions may vary depending on actual implementations.

In some embodiments, the sensing region (120) extends from a surface of the input device (100) in one or more directions into space, for example, until a signal-to-noise ratio falls below a threshold suitable for object detection. For example, the distance to which this sensing region (120) extends in a particular direction, in various embodiments, may be on the order of less than a millimeter, millimeters, centimeters, or more, and may vary with the type of sensing technology used and/or the accuracy desired. In some embodiments, the sensing region (120) detects inputs involving no physical contact with any surfaces of the input device (100), contact with an input surface (e.g. a touch surface) of the input device (100), contact with an input surface of the input device (100) coupled with some amount of applied force or pressure, and/or a combination thereof.

In various embodiments, input surfaces may be provided by surfaces of a housing of the input device (100) within which the sensor electrodes reside, by face sheets applied over the sensor electrodes or any casings, etc. In some embodiments, the sensing region (120) has a rectangular shape when projected onto an input surface of the input device (100).

The input device (100) may utilize any combination of sensor components and sensing technologies to detect user input in the sensing region (120). The input device (100) includes one or more sensing elements for detecting user input. As several non-limiting examples, the input device (100) may use capacitive, elastive, resistive, inductive, magnetic, acoustic, ultrasonic, and/or optical techniques.

Some implementations are configured to provide images that span one, two, three, or higher-dimensional spaces. An image is a collection of measurements of the sensing region where each measurement corresponds to a particular position on the sensing region. For example, in capacitive implementation, a capacitive image has a capacitive measurement for each location of the sensing region. Some implementations are configured to use and/or provide projections of input along particular axes or planes. A projection is an aggregation of measurements along the axis or plane. For example, a projection may have multiple values, where each value is along a first axis, and each value is a sum of the measurements along a second axis. By way of a more specific example, a column projection may have a single value for each row of a column, where each single value corresponds to a sum of the measurement values for the row. Further, some implementations may be configured to use and/or provide a combination of one or more images and one or more projections.

The input device (100) may utilize various sensing technologies to detect user input. Example sensing technologies may include resistive, inductive, capacitive, elastive, magnetic, acoustic, ultrasonic, and optical sensing technologies. In some embodiments, the input device (100) may include one or more sensing elements configured to implement the various sensing technologies.

In some embodiments, the input device (100) may implement resistive sensing technologies to detect user input. For example, the sensing region (120) may be formed by a flexible and conductive first layer separated by one or more spacer elements from a conductive second layer. The sensing region (120) may detect user input by creating one or more voltage gradients across the layers and sensing when the first layer is brought in contact with the second layer. More specifically, pressing the flexible first layer may deflect it sufficiently to create electrical contact between the layers, resulting in voltage outputs reflective of the point(s) of contact between the layers. These voltage outputs may be used to determine positional information of the detected inputs.

In other embodiments, the input device (100) may utilize inductive sensing technologies to detect user inputs. For example, the sensing region (120) may include one or more sensing elements configured to pick up loop currents induced by a resonating coil or pair of coils. The input device (100) may then detect user input based on a combination of the magnitude, phase, and/or frequency of the currents. The characteristics of the loop currents may further be used to determine positional information about the detected inputs.

In some embodiments, the input device (100) may utilize capacitive sensing technologies to detect user input. For example, the sensing region (120) may input one or more capacitive sensing elements (e.g., sensor electrodes) to create an electric field. The input device (100) may detect inputs based on changes in the capacitance of the sensor electrodes. More specifically, an object in contact with (or in close proximity to) the electric field may cause changes in the voltage and/or current in the sensor electrodes. Such changes in voltage and/or current may be detected as "signals" indicative of user input. The sensor electrodes may be arranged in arrays or other regular or irregular patterns of capacitive sensing elements to create electric fields. In some implementations, some sensing elements may be ohmically shorted together to form larger sensor electrodes. Some capacitive sensing technologies may utilize resistive sheets that provide a uniform layer of resistance.

Some capacitive sensing technologies may be based on "self capacitance" (also referred to as "absolute capacitance") and/or mutual capacitance (Also referred to as "transcapacitance"). Absolute capacitance sensing methods detect changes in the capacitive coupling between sensor electrodes and an input object. Absolute capacitance sensing measures the self-capacitance of the sensor electrode, where the self-capacitance is the amount of electric charge that must be added to a sensor electrode to raise the sensor electrode's electric potential by one unit (e.g., one volt). The self-capacitance of the sensor electrode changes when an input object is proximate to the sensor electrode. For example, an input object near the sensor electrodes may alter the electric field near the sensor electrodes, thus changing the measured capacitive coupling. In some embodiments, the input device (100) may implement by modulating sensor electrodes with respect to a reference voltage (e.g., system ground), and detecting the capacitive coupling between the sensor electrodes and input objects. The reference voltage may be a substantially constant voltage, a varying voltage, or corresponds to a system ground. Measurements acquired using absolute capacitance sensing methods may be referred to as absolute capacitive measurements.

Transcapacitance sending methods detect changes in the capacitive coupling between sensor electrodes. For example, an input object near the sensor electrodes may alter the electric field between the sensor electrodes, thus changing the measured capacitive coupling of the sensor electrodes. In some embodiments, the input device (100) may implement transcapacitance sensing by detecting the capacitive coupling between one or more transmitter sensor electrodes (also "transmitter electrodes" or "transmitter") and one or more receiver sensor electrodes (also "receiver electrodes" or "receiver"). Signals on the transmitter sensor electrodes may be modulated relative to a reference voltage (e.g., system ground) to transmit transmitter signals while receiver sensor electrodes may be held at a substantially constant voltage relative to the reference voltage to receive resulting signals. The reference voltage may be a substantially constant voltage or may be system ground. The resulting signal may be affected by environmental interference (e.g., other electromagnetic signals) as well as input objects in contact with, or in close proximity to, the sensor electrodes. Sensor electrodes may be dedicated transmitters or receivers, or may be configured to both transmit and receive. Measurements acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

The processing system (110) may be configured to operate the hardware of the input device (100) to detect input in the sensing region (120). The processing system (110) may include parts of, or all of, one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes. Further, a processing system for an absolute capacitance sensor device may include driver circuitry configured to drive absolute capacitance signals onto sensor electrodes, and/or receiver circuitry configured to receive signals with those sensor electrodes. In one or more embodiments, a processing system for a combined mutual and absolute capacitance sensor device may include any combination of the above described mutual and absolute capacitance circuitry. In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators, etc.

The processing system (110) may be implemented as a set of modules that handle different functions of the processing system (110). Each module may be implemented in hardware, firmware, software, or a combination thereof. In some embodiments, the processing system (110) may include circuitry (e.g., determination module (150)) configured to determine when at least one input object is in a sensing region, determine signal to noise ratio, determine positional information of an input object, identify a gesture, determine an action to perform based on the gesture, a combination of gestures or other information, and/or perform other operations. In some embodiments, the processing system (110) may include circuitry (e.g., sensor module (160)) configured to drive the sensing elements to transmit transmitter signals and receive the resulting signals. In some embodiments, the sensor module (160) may include sensory circuitry that is coupled to the sensing elements. The sensory circuitry may include, for example, a transmitter module including transmitter circuitry that is coupled to a transmitting portion of the sensing elements and a receiver module including receiver circuitry coupled to a receiving portion of the sensing elements.

Although FIG. 1 shows only determination module (150) and sensor module (160), alternative or additional modules may exist in accordance with one or more embodiments of the disclosure. Such alternative or additional modules may correspond to distinct modules or sub-modules than one or more of the modules discussed above. Example alternative or additional modules include hardware operation modules for operating hardware such as sensor electrodes and display screens, data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g. to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. A baseline is an estimate of the raw measurements of the sensing region when an input object is not present. For example, a capacitive baseline is an estimate of the background capacitance of the sensing region. Each sensing element may have a corresponding individual value in the baseline. As yet further examples, the processing system (110) may determine positional information, recognize inputs as commands, recognize handwriting, and the like.

In some embodiments, the input device (100) includes a touch screen interface, and the sensing region (120) overlaps at least part of an active area of a display screen. For example, the input device (100) may include substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen may be operated in part or in total by the processing system (110).

While many embodiments are described in the context of a fully-functioning apparatus, the mechanisms of are capable of being distributed as a program product (e.g., software) in a variety of forms. For example, the mechanisms of the disclosure may be implemented and distributed as a software program on information-bearing media that are readable by electronic processors (e.g., non-transitory computer-readable and/or recordable/writable information bearing media that is readable by the processing system (110)). Additionally, the embodiments apply equally regardless of the particular type of medium used to carry out the distribution. For example, software instructions in the form of computer readable program code to perform embodiments may be stored, in whole or in part, temporarily or permanently, on a non-transitory computer-readable storage medium. Examples of non-transitory, electronically-readable media include various discs, physical memory, memory, memory sticks, memory cards, memory modules, and or any other computer readable storage medium. Electronically-readable media may be based on flash, optical, magnetic, holographic, or any other storage technology.

Although not shown in FIG. 1, the processing system, the input device, and/or the host system may include one or more computer processor(s), associated memory (e.g., random access memory (RAM), cache memory, flash memory, etc.), one or more storage device(s) (e.g., a hard disk, an optical drive such as a compact disk (CD) drive or digital versatile disk (DVD) drive, a flash memory stick, etc.), and numerous other elements and functionalities. The computer processor(s) may be an integrated circuit for processing instructions. For example, the computer processor(s) may be one or more cores or micro-cores of a processor. Further, one or more elements of one or more embodiments may be located at a remote location and connected to the other elements over a network. Further, embodiments may be implemented on a distributed system having several nodes, where each portion of the disclosure may be located on a different node within the distributed system. In one embodiment, the node corresponds to a distinct computing device. Alternatively, the node may correspond to a computer processor with associated physical memory. The node may alternatively correspond to a computer processor or micro-core of a computer processor with shared memory and/or resources.

While FIG. 1 shows a configuration of components, other configurations may be used without departing from the scope of the disclosure. For example, various components may be combined to create a single component. As another example, the functionality performed by a single component may be performed by two or more components.

Figure 2:
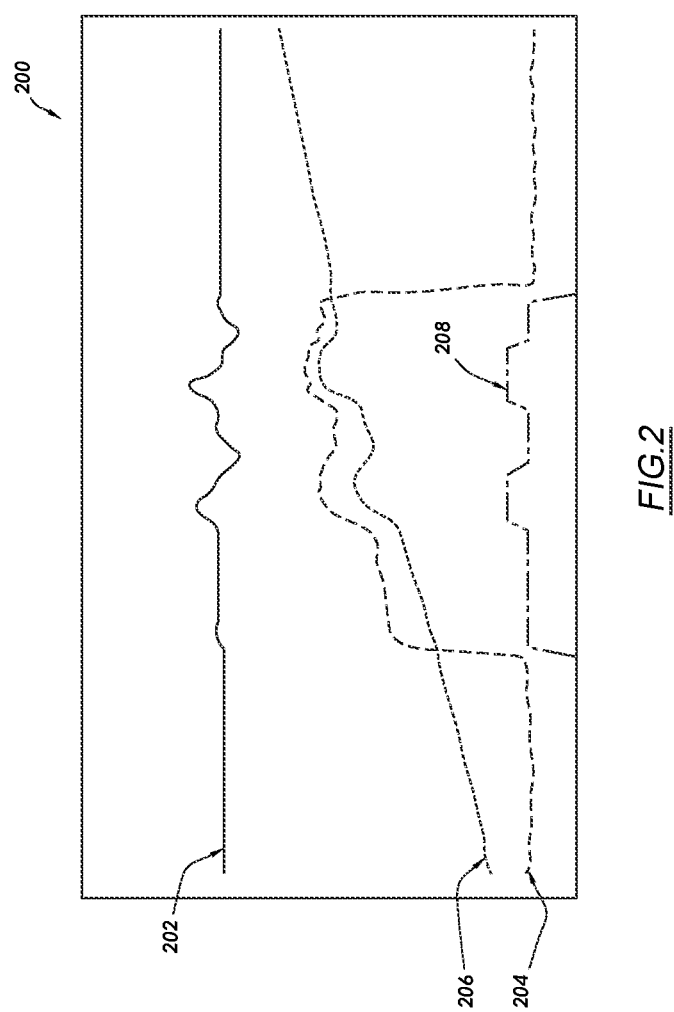
FIG. 2 shows a graph in accordance with disclosed embodiments.

Turning to FIG. 2, FIG. 2 shows a time series graph (200) for one touch event having two force events. Thus, FIG. 2 shows measured properties, derived properties, and output that results when a user touches an input device.

In FIG. 2, line (202) represents a derivative of the estimated force on the input device's electrode. Line (204) represents a capacitance measurement with respect to the input device's electrode. Line (206) represents an estimated force on the input device's electrode. Line (208) represents a reported output to the input device's processing circuitry (i.e., whether a finger has touched the input device or been lifted from the input device).

The X-axis of the graph represents time (typically measured in milliseconds, though only a relative scale is shown in FIG. 2). The Y axis of the graph varies in units depending on which line is referenced. For line (202) the Y axis represents a derivative of the force. Line (202) has a constant offset so as not to clutter FIG. 2. For line (206), the Y axis represents the amount of the force. For line (204), the Y axis represents capacitance. For line (208), the Y axis indicates "no touch" (zero output), "constant touch" (flat output), and "increased touch" (increasing output).

In FIG. 2, the long-term slope of line (206) is due to cooling of mobile device (e.g., phone) after removal from a "pocket" of a user's pants or shirt, or other such location. In other words, once the mobile device is separated from physical contact with the person's body heat, the mobile device begins to cool, resulting in a continuing increase in electrical resistance in the sensing electrode.

One or more embodiments may be applied to touchscreens which are planar, optically clear, and occupied with electrodes for sensing touch. One or more embodiments are directed to temperature mitigation techniques, which can be used with or without hardware compensation (e.g., a Wheatstone bridge, described further below).

The resistance measured may change due to strain, temperature, or both strain and temperature. Several approaches are described to mitigate errors in estimating strain from a change in electrical resistance of the electrode due to temperature-induced changes to electrical resistance of the electrode. Some of the approaches are to avoid the effects of temperature and some approaches are to reduce the effects of the temperature signal when errors exist. One or more of the following approaches may be used in one or more embodiments.

Note that, as described herein, the actual sensing of touch may or may not be a result of a direct calculation using resistance. For example, absolute capacitive sensing or trans-capacitive sensing may be performed using rows and columns of electrodes to identify touch location as described above with reference to FIG. 1. Force may be calculated using a resistance that changes with temperature. In this case, the specific selected electrodes may be used to determine resistance values, and from these values estimate the force on the input device.

1. Avoiding Finger Heat.

Figure 3:
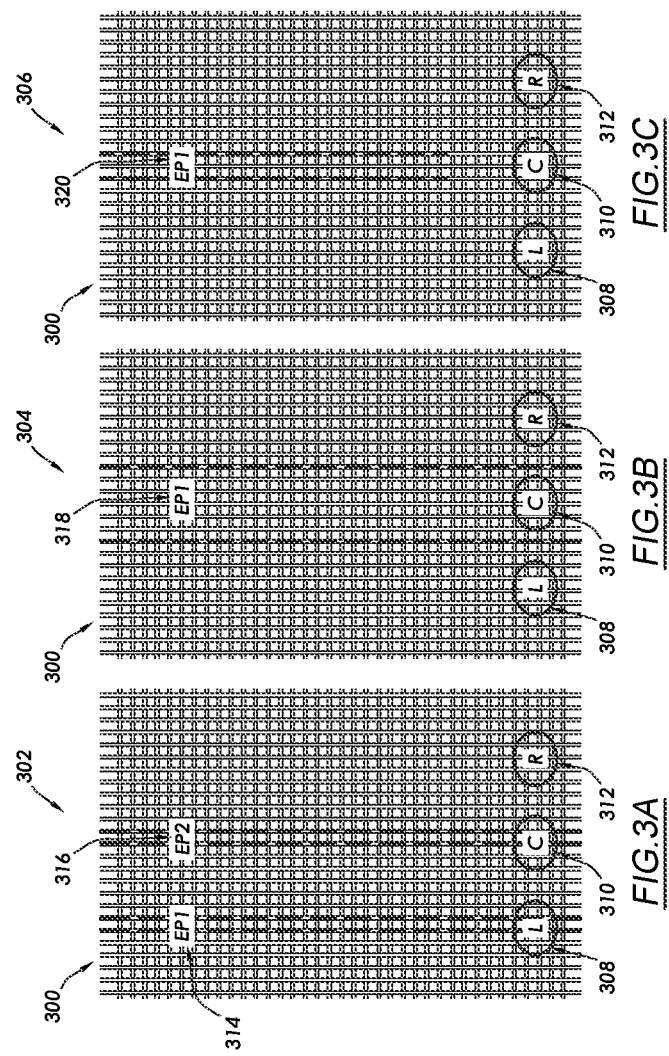
FIGS. 3A, 3B, and 3C show diagrams of electrodes in accordance with disclosed embodiments.

FIG. 3 includes FIG. 3A (302), FIG. 3B (304), and FIG. 3C (306), each of which shows an input device. Any of the input devices of FIG. 3 may be input device (100) of FIG. 1. Each of the input devices of FIG. 3 shows a sensing region, such as sensing region (120) of FIG. 1, that is sensitive to touch. Each of the sensing regions shown in FIG. 3 include electrodes arranged in columns and rows that form a grid pattern (300). Each electrode may be characterized by a resistance which may vary with both temperature and an amount of pressure applied to the surface of the input device. The electrodes may be on, in, or underneath surfaces of the input devices.

One or more of the following techniques may be applied to adjust or avoid the effect of finger heat changing a resistance of an electrode, resulting in incorrect estimation of force. In one or more embodiments, the sensing of the force is at a different location on the input device than the location on the input device of the finger or input object causing the heat. Thus, the electrical resistance of the electrode (or portion of an electrode) that is used to measure the resistance (for purposes of performing the force-from-electrical resistance calculation) is not influenced by or is not as influenced by the heat of the user's finger or the heat of the user's input device. Stated differently, a physical separation between the point of resistance measurement and the point where force is applied reduces the error in the resistance measurement caused by heat applied to the electrode.

Referring to FIG. 3 generally, FIG. 3 shows diagrams of electrodes for sensing strain (the rows and columns of lines) with virtual OD buttons (ovals) shown as "L" button (308), "C" button (310), and "R" button (312). The hashed lines shown in FIG. 3 are possible choices for subsets of electrodes to be selected from the set of electrodes used for sensing force. Reference numerals common to each of FIG. 3A (302) through FIG. 3C (306) refer to common objects and have common descriptions.

In an embodiment, the determination of force on the input device by means of measuring a change in resistance may be improved by avoiding measuring resistance in areas of the input device where heat from a touching finger is expected. Thus, in one embodiment, the device avoids measuring resistance at expected touch locations, such as the virtual buttons, L button (308), C button (310), and R button (312).

More generally, the technique of avoiding finger heat may be accomplished by any of four different methods, or a combination thereof. With respect to FIG. 3A (302), the techniques may include identifying a finger location, then avoid finger heat by sensing resistance some distance away from the finger location. With respect to FIG. 3B (304), the techniques may include using a modified electrode pattern to sense resistance away from known virtual button locations. With respect to FIG. 3C (306), the techniques may include using a modified electrode pattern having no routing trace, thus avoiding heat from hand grip when making a resistance measurement. With respect to any of FIG. 3A (302) through FIG. 3C (306), the techniques may include limiting regions of the screen where force will be reported (e.g., resistance measurements are made only away from the virtual buttons).

In FIG. 3A (302), two electrode pairs (i.e., EP1 (314) and EP2 (316)) are located under button L (308) and button C (310). To avoid finger heat, one electrode pair of EP1 (314) and EP2 (316) is selected for measurement according to the button touched by user. For example, if button C (310) is touched then the EP1 (314) electrode pair is used, while if button L (308) is touched then the EP2 (316) electrode pair is used. In an embodiment, the immediate neighboring location to the touch is used, though in other embodiments, a more distant location to the touch on the input device may be used.

In FIG. 3B (304), only one force pair, EP1 (318), exists, which is aligned to thread between buttons. In FIG. 3B (304), some risk of heat from a large input object, such as a large finger, may exist. In particular, a large input object may cover both electrodes of the electrode pair causing finger heat to both the electrodes.

In FIG. 3C (306) a modified electrode pattern, EP1 (320), is selected at center of screen (where most bending of the screen occurs). However, because the electrodes have a gap (322) to the buttons, the electrodes are not exposed to finger heat near the buttons. The electrode pattern in FIG. 3C (306) is explained in FIG. 4. The embodiment shown in FIG. 3A may be suitable for touch/force at any random location on the touch surface. The term "touchscreen" refers to the surface of the input device, together with the electrodes, whether the electrodes are on the surface, in the surface, or underneath the surface relative to the user.

For any of FIG. 3A, FIG. 3B, or FIG. 3C, the buttons (i.e., button L (308), button C (310), and button R (312)) may be located anywhere on the screen shown, and not just at the bottom of the screen. Similarly, these buttons need not be all in a line, as shown in these figures, but may be provided in any desirable pattern. The locations of the buttons may change which electrodes are selected according to the techniques described above, but not necessarily the underlying techniques themselves. Therefore, a similar technique may be applied regardless of location of the physical and/or virtual buttons shown in these figures.

Additionally, for any of FIG. 3A, FIG. 3B, or FIG. 3C, the locations of the electrodes may be varied. For example, the electrodes shown in FIG. 3B could be presented to the left side of the L button (308) and to the right side of the R button (312), possibly in addition to the electrode configuration shown. Thus, the examples provided above are not an exhaustive list of embodiments of the techniques described with respect to each of FIG. 3A, FIG. 3B, and FIG. 3C.

Figure 4:
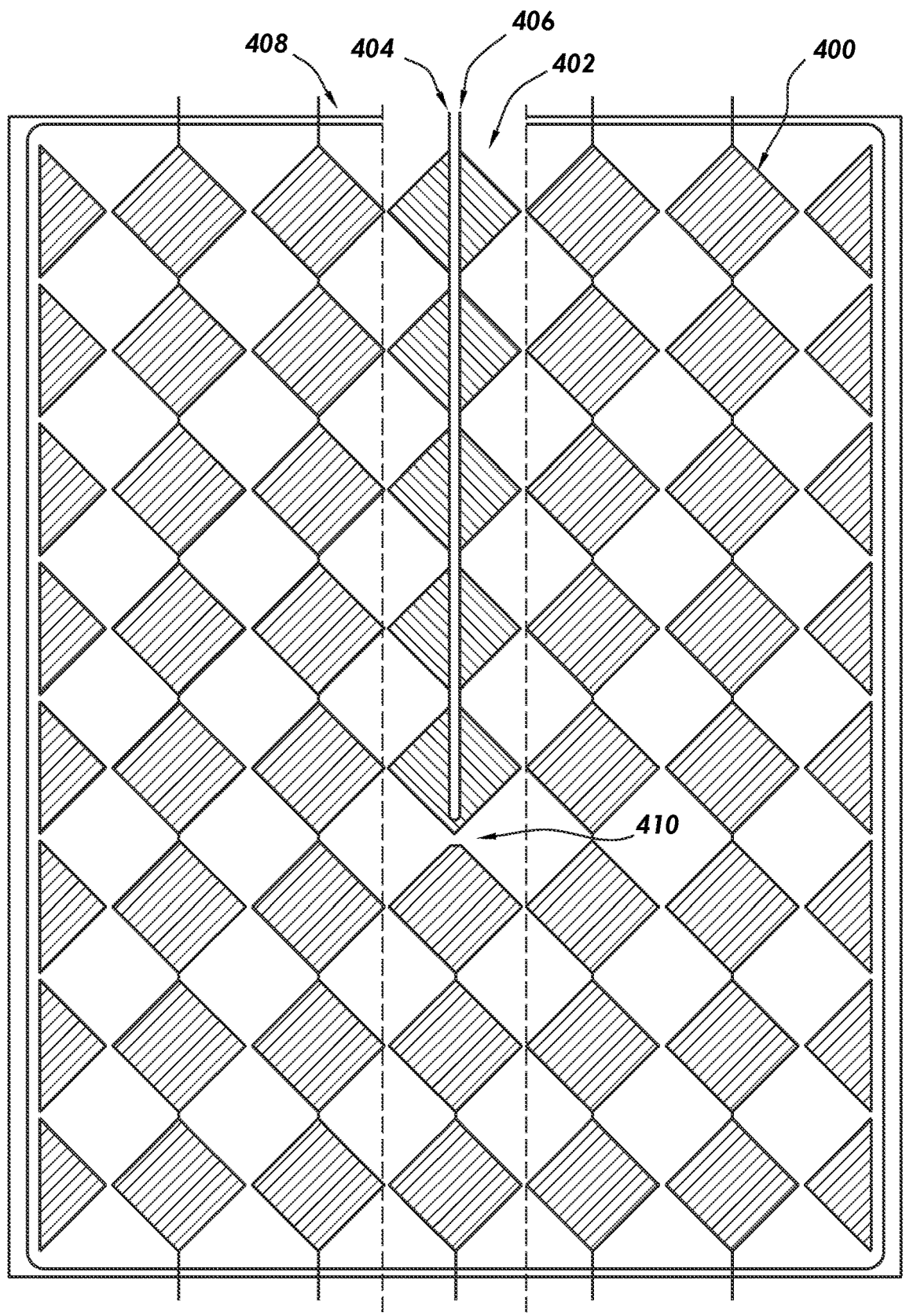
FIG. 4 shows an example of a pattern of electrodes in accordance with disclosed embodiments.

FIG. 4 shows an example of a pattern of electrodes (shown as diamonds, such as diamond (400)) for sensing force in sub-section of an electrode. Specifically, the patterns of white and hashed diamonds identify a linear "string" of electrodes which are connected with "jumpers" (not shown). For example, the hashed diamonds might be used only as transcapacitive receivers while the white diamonds are transcapacitive transmitters (i.e., mutual capacitance). Transcapacitive measurements may be acquired by using the transmitters to transmit signals and measuring resulting signals received via the receiver electrodes.

FIG. 4 illustrates a change to the electrode pattern for sensing strain in only a sub-section of a column (i.e., subsection (402) shown as diamonds with a hash pattern) while also avoiding (finger) heat in another sub-section (i.e., the other diamonds shown without the hash pattern). In at least some embodiments, an added advantage exists in that both terminals (i.e., terminal (404) and terminal (406)) appear on one edge. Thus, in such embodiments, edge routing and risk associated with exposing routing traces to grip heat may be avoided.

Subsection (402) is a bifurcated diamond pattern forming a loop with both terminals (terminal (404) and terminal (406)) on the top edge (408). At the location of arrow (410), this point may be open or shorted (i.e. the electrodes in subsection (402) are connected to the remaining electrodes, such as diamond (400)). For single-routed capacitive sensing, the point at arrow (410) may be shorted.

For the purpose of resistance measurement, where the arrow shows a cut between two diamonds, the presence of the open or short is not relevant. To measure resistance one can connect to two terminals at the top (see terminal (404) and terminal (406)). In the case of an open (i.e., if there is a "dead end" at the 3 diamonds below the cut) the measured resistance will not change, as a result of Ohm's-law. However, for mutual capacitive measurements, some panels may be "single routed" while others are "double routed" (to top and bottom). Routing refers to the routing traces (approximately 10 microns wide) which go around the edges of the diamonds (see, e.g., FIG. 5). For single-routing, if there is a cut at the arrow (410), then the trans capacitance signal cannot reach the lower 3 diamonds. In this case, the trans capacitance signal will have a dead spot at the space indicated by the arrow (410).

Figure 5:
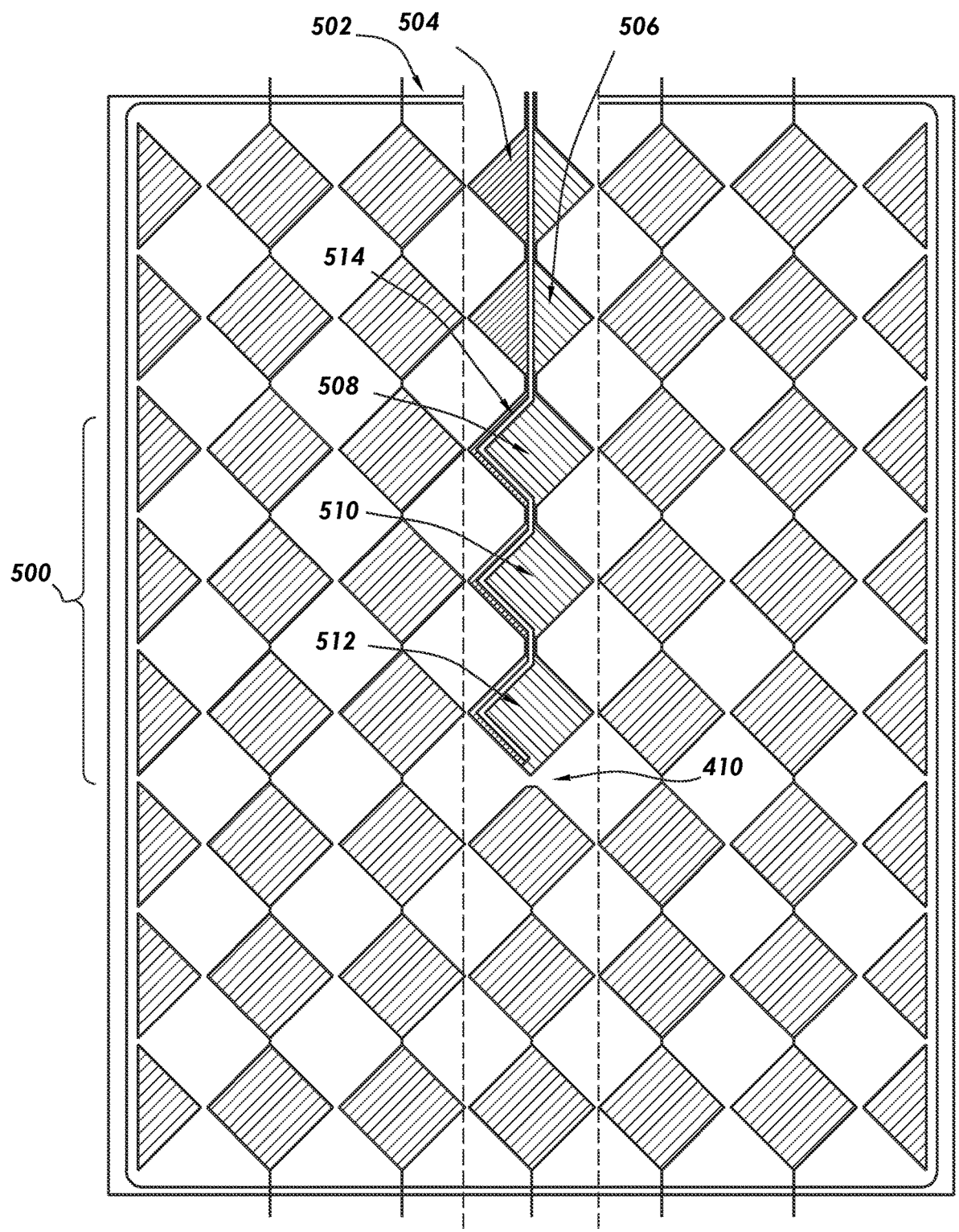
FIG. 5 shows an example of a pattern of electrodes in accordance with disclosed embodiments.

FIG. 5 shows a pattern for sensing force in selected electrodes. FIG. 5 illustrates an idea similar to FIG. 4; however, the force "focus" can be directed to individual electrodes (shown as diamonds).

In the example of FIG. 5, the motivation is to "focus" on the central region (500) of the screen where most strain may occur even when a finger is pressing near the edge (502). Two of the electrodes, shown at diamond (504) and diamond (506), are divided equally. However, three central electrodes, shown at diamond (508), diamond (510), and diamond (512) are divided unequally. A trace (514) is laid in addition to the diamonds. The trace (514) is narrower than, and has higher resistance compared to, the corresponding electrodes (i.e., diamonds (508), (510), and (512). The trace nevertheless may be made out of conducting materials, including the same or similar material as the electrodes, so long as the trace has a higher resistance than the electrodes shown as diamonds.

While the gauge factor may be the same for both the trace (514), and the electrodes, the trace (514) dominates due to higher resistance (as all segments are "connected" in series). The technique does not fundamentally increase or decrease gauge factor, but it does put focus where strain is highest, resulting in higher response for the same force applied in one or more embodiments. Effectively, the triangular regions act mainly as low resistance traces leading to the "active" narrow traces (514).

The technique of FIG. 5 may be applied to ITO or metal mesh. As with FIG. 4, there is almost no impact on 2D capacitive-touch performance in one or more embodiments.

2. Estimating Screen Display Heat.

One or more embodiments may use information about the display to estimate the amount of screen heat and then update the force measurements based on the estimation of heat. Heat will be produced in the process of generating and emitting light to generate the display on the screen. The heat will conduct and raise temperature of the electrodes used for touch. Thus, one may predict or estimate electrode temperature based on knowledge of image displayed on screen. For example, if the screen image indicates the electrodes should be five degrees Celsius higher than if no display is emitted from the screen, then this knowledge can be used to compensate the measured resistance when calculating force from resistance. If the measured resistance does not match the expected resistance, then the mis-match could be attributed to change in strain. In turn, the change in strain due to the mis-match can then be used to calculate the force more accurately than measuring the resistance alone.

In one or more embodiments, the location in which the information of the display is obtained is only at the location of the force sensor electrodes. For example, if two electrodes are used for force, then only the information about the pixels at the two electrodes (e.g., two columns of pixels, or region within a threshold distance to the electrodes) is obtained and used. Estimating screen display heat may be performed using the following techniques. In particular, the one or more embodiments estimate the screen heat, filter the resistance changes that occur in the electrodes on account of the screen heat, and then calculate the estimated force on the screen accordingly.

Screen heat estimation is an estimate of the heat of the screen, such as the heat produced by the display of images on the screen. In other words, by estimating the amount of heat produced when displaying images on a screen, an estimate of screen heat is determined and may be used to adjust force measurements. Screen heat may be estimated and used by acquiring statistics of an image displayed on an input device using touch and display integration (TDDI) in a resistance-sensing electrode region. Screen heat also may be estimated by identifying colors displayed under electrodes, and correlating the displayed colors to estimated heat flow. For example, information about which color and amount of colors displayed, the amount of heat for each color, and the screen brightness may be used for the screen heat estimation.

The estimated resistance change due to screen heat may be filtered from a total measured change in resistance. In this manner, the calculation of force applied from the measured resistance is improved in accuracy.

Note that the one or more embodiments described herein may be of greater benefit in devices that use a metal mesh. The temperature coefficient for metal mesh is about ten times that of ITO (Indium Tin Oxide) devices. Put another way, the temperature problem described above is ten times worse with metal mesh devices as compared to ITO device. Devices made from both materials can benefit from the one or more embodiments described herein; however, devices that include metal mesh benefit more greatly from the one or more embodiments described herein relative to ITO devices.

3. Baselining the Force Signal Upon Finger Landing Event.

Figure 6:
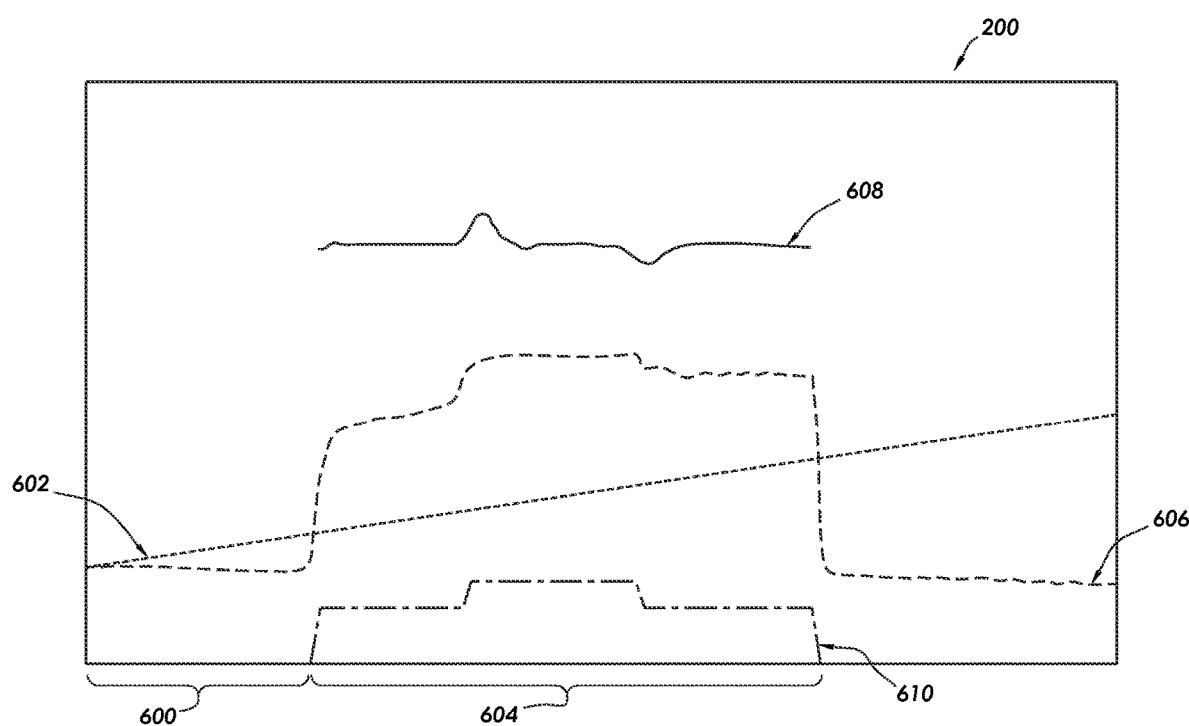
FIG. 6 shows a graph in accordance with disclosed embodiments.

FIG. 6 shows an example graph in one or more embodiments. In FIG. 6, line (602) represents a change in electrical resistance in an electrode of an input device over time due to a change in temperature. Line (603) represents a change in electrical resistance in an electrode due to a combination of force applied to the electrode and a temperature change in the electrode. Thus, line (603) also represents an estimated force on the input device's electrode, as the force is estimated from the measured resistance according to a known mathematical formula. Line (606) represents a capacitance measurement with respect to the input device's electrode. Line (608) represents a derivative of the calculated force. Line (610) represents a reported output to the input device's processing circuitry (i.e., whether a finger has touched the input device or been lifted from the input device).

The X-axis of the graph represents time (typically measured in milliseconds, though only a relative scale is shown in FIG. 6). The Y axis of the graph varies in units depending on which line is referenced. For line (602) and line (603), the Y axis represents the amount of resistance. For line (606), the Y axis represents capacitance. For line (608), the Y axis indicates a derivative of the force. For line (610), the Y axis indicates "no touch" (zero output), "constant touch" (flat output), and "increased touch" (increasing output).

Baselining the force signal upon a finger landing event may be performed using one or more embodiments to mitigate changes in electrode resistance due to temperature changes. One or more embodiments may use one or more of the following techniques to baseline the force signal (i.e., the force calculated from the resistance measurement).

In one embodiment, only drift in resistance measurements after finger landing is consequential. In other words, the calculated force should be zero when no finger is present.

Initially, the force measurement sequence is buffered by buffering the resistance measurements of the electrodes. The resistance measurements in the buffer are used as a baseline at frame "N" prior to finger landing. Thus, the resistance measurements in the buffer refer to a stable reference. Buffering occurs within a first time interval, as indicated by brackets (600).

A slope for the change in resistance measurements is observed within the first time period. In the example shown, the slope observed is the slope of line (602). The slope of line (602) represents a resistance change caused by a temperature change in the electrode.

Note that only a single resistance measurement is taken; thus, it is not possible to directly separate the resistance change due to a temperature change and the resistance change due to a change in force on the electrode. However, the change in resistance due to temperature may be estimated by projecting the slope of line (602) into a second time interval, shown at brackets (604), during which finger landing has occurred.

Finger landing in the second time interval is detected as a larger change in resistance values than observed in line (602) over the first time period. Thus, finger landing is detected where the slope of line (603) increases relative to the slope of line (602).

Again, to account for the resistance change due to temperature, a baseline resistance change (i.e., the change in resistance due to temperature) is estimated from the projected slope of the line (602) in the second time interval indicated by brackets (604). Once baselined, the resistance measurements estimated according to the predicted long linear slope of line (602) (i.e., the global temperature drift) are filtered from the total resistance measurements, indicated by line (603). The force is calculated accordingly from the filtered resistance measurements.

In an embodiment, reporting of force detection may be delayed if the larger change in force is not detected. In this manner, calculations of the force from the resistance may be avoided altogether if the slope of the line does not change.

In one or more embodiments, if the force signal is continually drifting, the force baseline may be obtained upon a finger touch event (i.e., at the beginning of the second time interval at brackets (604))—or slightly before the touch (approximately 10 frames, with each frame corresponding to about 10 milliseconds, though different time periods could be used between about 5 milliseconds through about 100 milliseconds). This technique helps to avoid a risk for the case of a very hard landing (touch detection and significant force occur simultaneously).

4. Compute Derivative of Force Signal to Identify Events.

The derivative of the calculated force may be used to implicitly reduce the measurements of resistance caused by the effects of temperature. The existence of a spike in the resistance measurement may indicate the existence of force applied (i.e., by a finger).

In this example, a positive transient sets a state of the input device to "force applied". The term "positive" transient refers to a rising slope from a derivative calculation (and likewise a "negative" transient refers to a falling slope from a derivative calculation). Referring again to FIG. 6, the positive transient occurs at the onset of the second time interval at brackets (604), where the resistance measurements spike precipitously. Likewise, a negative transient sets a state of the input device to "no force applied". Referring again to FIG. 6, the negative transient occurs at the end of the second time interval at brackets (604), where the resistance measurements drop precipitously. In an embodiment a finger-lift event or finger-land event sets the state of the input device to "no force applied."

The output force may be reported from the total resistance values, as indicated by line (610). A mathematical derivative may be taken of the calculated force value, as shown by line (608). The line (608) showing derivative of the force indicates spikes where finger force is most likely to be applied to the input device. In other words, line (608) may be used to identify the onset of force seen in line (610). Note that because line (602) is a measurement of resistances prior to the onset of force, the line (602) is also a linear projection of the force signal prior to the finger landing event.

In an embodiment, an initial estimate of the force may include filtering the resistance signal by removing resistance values corresponding to the line (602), as described above. Thus, a combination of the techniques described herein may be used both to improve estimation the force, and to ensure that any force estimation based on resistance actually corresponds to the onset of a finger on the input device.

5. Combine Pseudo Force with Resistance Signal to Minimize False Trigger Events.

Figure 7:
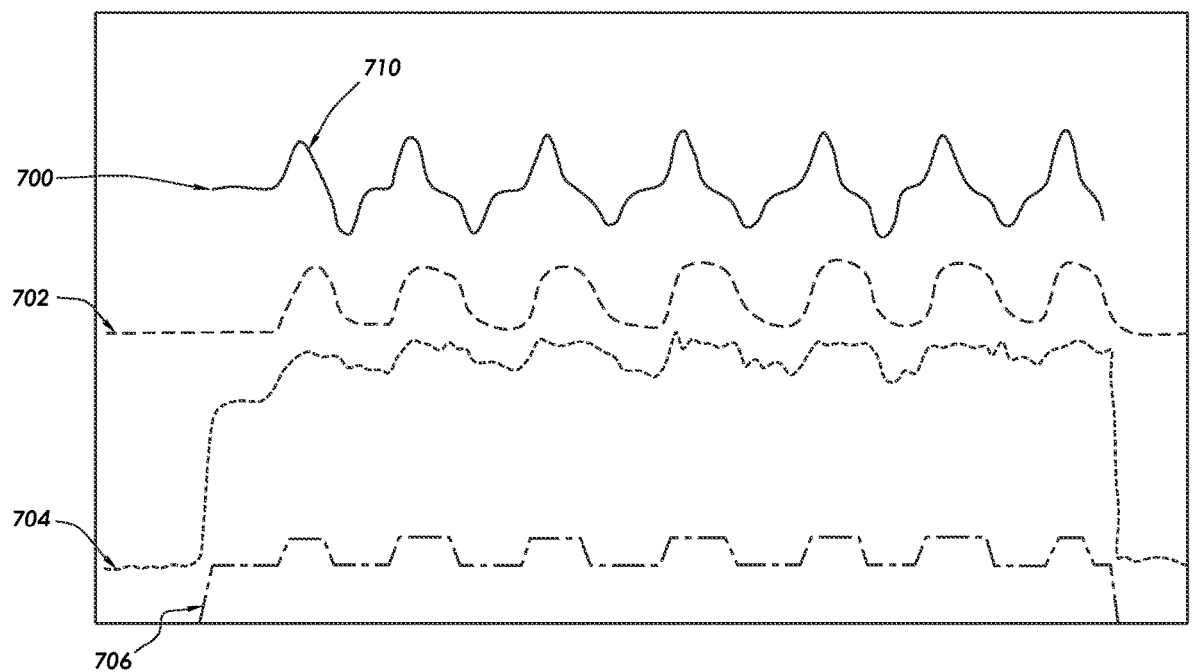
FIG. 7 shows a graph in accordance with disclosed embodiments.
Figure 8:
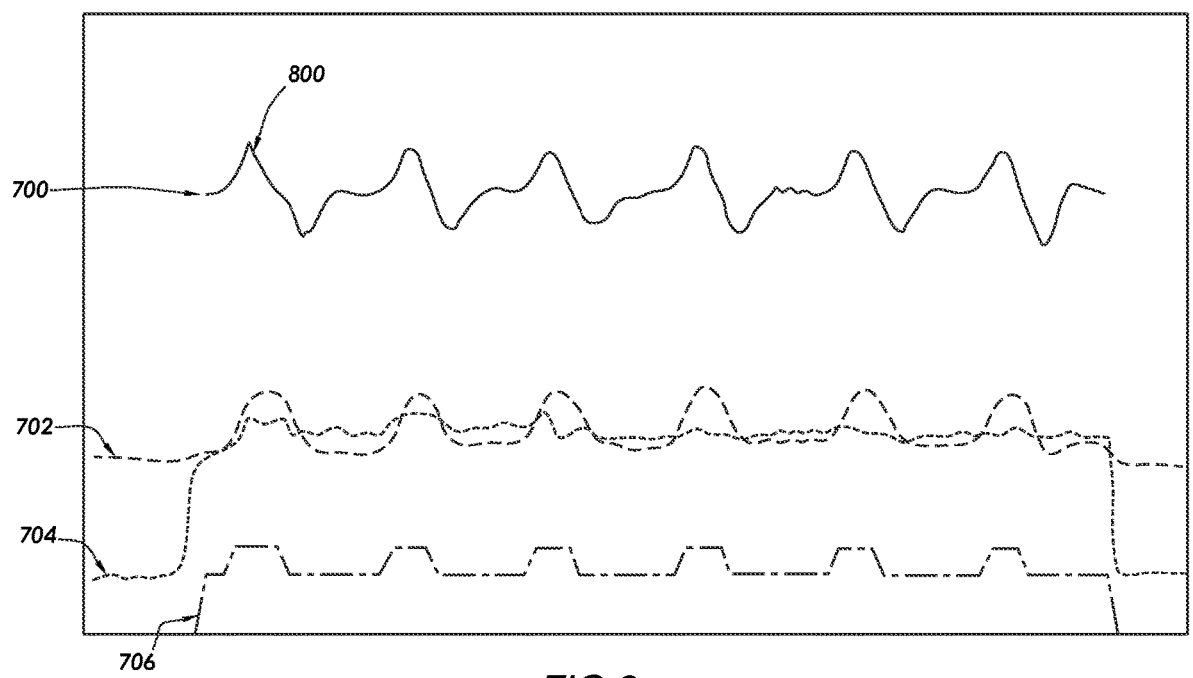
FIG. 8 shows a graph in accordance with disclosed embodiments.
Figure 9:
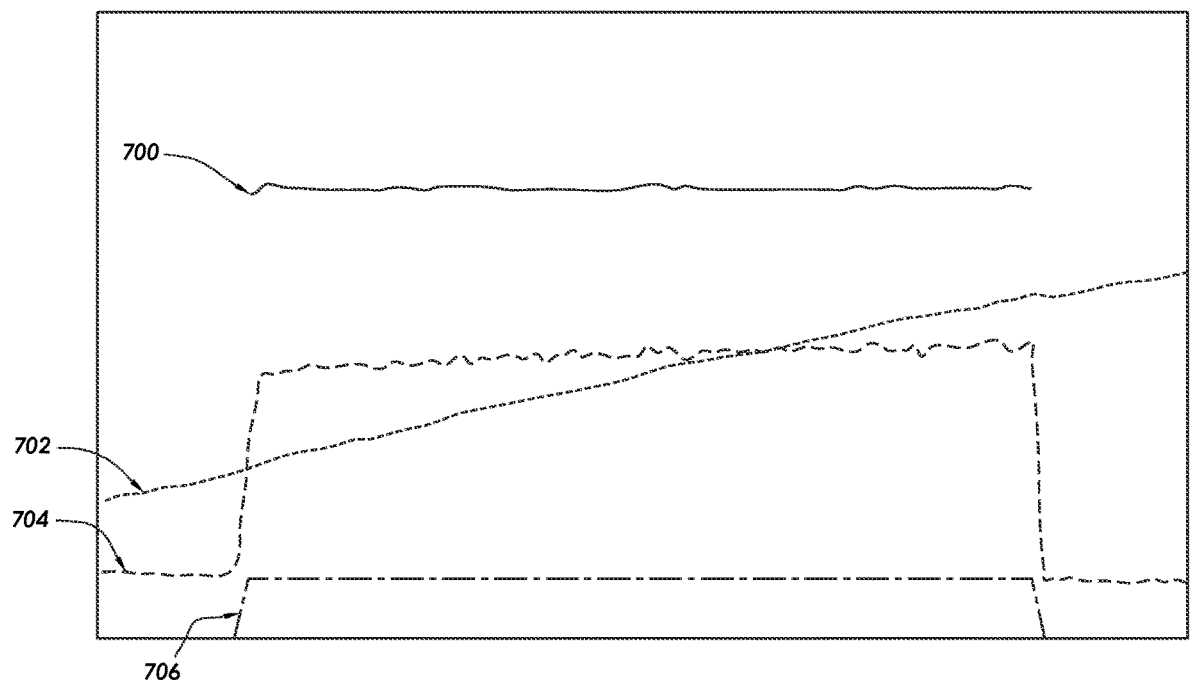
FIG. 9 shows a graph in accordance with disclosed embodiments.

FIG. 7 through FIG. 9 are referenced with respect to the technique of combining a calculated pseudo force with the resistance signal to minimize false trigger events to the input device. For example, FIG. 7 is an example of pressing with flat of finger. Seven force events are shown in FIG. 7, without lifting a finger. In this case, the purple trace (self-capacitance) is not constant, confirming the force changed. FIG. 8 shows pressing with the tip of a finger. Six force events are shown in FIG. 8, without lifting a finger. In this case, the purple trace (self-capacitance) is not constant, confirming the force changed. Note that in some embodiments, a self-capacitance press signal may be more reliable than a finger release signal. FIG. 9 shows touching the input device with the finger without substantial force. As shown in FIG. 9, little or no force is applied, and resistance increases with the cooling input device. The purple trace, representing self capacitance, is nearly constant, thereby confirming a no force event.

The one or more embodiments may incorporate a filter, such as a Kalman filter, to estimate input device state and to estimate events at the input device. A confidence in the pseudo force signal increases with finger size detected (footprint).

In some examples, the input device may also estimate a force being applied to an input device by measuring a change in capacitance of the electrodes disposed in, on, or underneath the surface of the input device relative to the user. Because the change in capacitance is not actually a measure of force, and is caused by an increase of surface area contact by a finger rather than the actual force, the resulting force measurement may be termed a pseudo force.

A touch-sensitive surface may generate a pseudo-force signal based on a contact with the touch-sensitive surface. The pseudo force in one such example may be based on the amount of capacitance resulting from a conductor (e.g., the user's finger) touching the touch-sensitive surface. The pseudo force detected at the touch-sensitive surface may not be a measure of the actual vertical displacement by a conductor at a single point on the touch-sensitive surface, but rather an estimation of the vertical displacement based on the size of the capacitance change.

The pseudo force may or may not accurately represent the amount of force actually exerted on the touch-sensitive surface. For example, the larger the surface of the conductor (e.g., a user's finger) used on the touch-sensitive surface, the larger the change in capacitance per amount of force exerted. If a user presses heavily against the touch-sensitive surface with a fleshy part of the finger, the amount of touch-sensitive surface area covered by the finger is greater than then when the same part of the finger is touching lightly. In some examples, the area covered, and the corresponding pseudo force, is also greater than when the user presses heavily with a bony part of a finger.

Thus, any indication to change the state of the input device from or to "force applied" and "no force applied" may be discarded if not corroborated by the pseudo force reading. If the pseudo force reading is about constant, the true force may be determined not to have changed. However, if the pseudo force reading is increasing, then the "force applied" state may be confirmed. Likewise, if the pseudo force reading is decreasing, then the "no force applied" may be confirmed.

The one or more embodiments contemplate that a user may use a stylus or other small object rather than a finger to interact with the input device. Thus, this procedure might not be used if the area of the object touching the input device is less than a preselected amount. The preselected amount may be about a size of the tip of the stylus.

The one or more embodiments also contemplate conditions of rapidly changing temperature. In this case, the force may be estimated using only the pseudo-force. Under certain conditions (e.g., rapidly changing temperature), it may not be possible to extract the force signal from the rapidly changing resistance measurement. When this situation is detected, one or more embodiments use a degraded mode (e.g., use only pseudo-force) which may be 80% or 90% reliable. An example of this situation includes removing an input device from a test chamber at −20 C, exposing the input device to room temperature, and attempting to use the force function to predict the force applied to the input device. In this situation, the pseudo force may be used as a temporary substitute for force estimation until the temperature of the input device stabilizes.

Attention is now returned to FIG. 7 through FIG. 9, which share common reference numerals. Line (700) refers to the derivative of the calculated force. Line (702) refers to the calculated force. Line (704) refers to the capacitance measurement (i.e., the pseudo force). Line (706) refers to the reported force output.

FIG. 7 shows the signals (lines (700) through (706)) that may be reported when the flat of a finger touches an input device. Seven force events, such as force event (708), are shown as peaks in the various lines, correspond to pressing with the flat of the finger without lifting the finger. Note that the capacitance measurement, line (704), is not constant, which confirms that the force changed. This fact can be used to corroborate a force calculated according to a resistance measurement, as shown by line (702). In this manner, the reported force for the input device is shown at line (706).

FIG. 8 shows the signals (lines (700) through (706)) that may be reported when pressing when the tip of a finger touches an input device. Six force events, such as force event (800), are shown as peaks in the various lines, corresponding to pressing the tip of the finger. Note, again, that the capacitance measurement, line (704), is not constant, which confirms that the force changed. This fact can be used to corroborate a force calculated according to a resistance measurement, as shown by line (702). In this manner, the reported force for the input device is shown at line (706).

FIG. 9 shows the signals (lines (700) through (706)) that may be reported when touching the input device with little or no force. The term "little force" refers to an amount of force insufficient to substantially change the resistance of the electrodes to a degree that allows a reliable (to within a pre-determined statistical amount) calculation of the force based on the resistance detected. However, due to cooling of the input device (perhaps because the input device was removed from a user's pocket), the resistance signal shown at line (702) is steadily increasing with time. Because the capacitance measurement, or the pseudo force, as shown by line (704), is approximately constant, it may be inferred that the input device should be in a "no force applied" state. The term "approximately constant" means constant to within a pre-selected statistical range of measurements. Thus, the output reported force, shown by line (706), is set as a constant (zero, or no force, in this case).

6. Conditional Use of Wheatstone Bridge.

In one or more embodiments, a Wheatstone bridge may be used to remove the effects of temperature-induced change to resistance in the electrodes with respect to the force calculation from resistance. In electronics, generally, a Wheatstone bridge is an electrical circuit used to measure an unknown electrical resistance by balancing two legs of a bridge circuit, one leg of which includes the unknown component. Each of the legs may contain one or more resistors. In the one or more embodiments, the "unknown" resistance is the measurement of resistance in the electrode that is susceptible to a temperature-induced change to resistance. A "known" resistance in the Wheatstone bridge is a resistance for an electrical component which either does not vary or varies only slightly (relative to the "unknown resistance") with temperature, or which is known in advance and does not vary with pressure applied to the input device.

In an embodiment, edge electrodes can be used for temperature compensation. A capacitance measurement at the edge may be used to identify when the input device is toughed or gripped at the edges. When an edge touch is detected, the one or more embodiments contemplate using a non-compensating Wheatstone bridge in the input device to remove the effects of temperature-induced changes to resistance when calculating a force based on a change in resistance in the electrodes of the input device.

When a four-element Wheatstone bridge is desirable, but risk of grip-heat exists, a dynamic bridge may be used. By default, four sensing electrodes are used. However, if grip fingers are detected (e.g., using capacitive touch sensing), then the system uses a two-electrode Wheatstone bridge, or other such option. Accordingly, the edge electrodes for temperature compensation may be excluded to avoid false trigger of force detection.

7. Reporting Force.

One or more embodiments may mitigate for the effects of force when reporting force. Further, "force" and "no force" may be reported with analog measurements. If a disagreement exists, then the processing system that responds to the force may be able to detect and mitigate for the effects of temperature.

This embodiment provides for a system of reporting both a binary state (touch/force) and a separate force estimate. The force estimate is separate from state estimate. The force estimate may decay to zero while the state of the input device remains as "force applied". However, the force estimate may increase slowly while state remains as "no force." In this example, the method of projecting an estimated force caused by a change in resistance in the electrodes from a change in temperature, as shown with respect to FIG. 6, may be used for a force estimate, but not for determining the state of the input device alone (as described with respect to FIG. 6).

The system may bifurcate force reporting into two streams: Stream 1 is a binary stream—"force detected" or "no force detected". Stream 2 is a signal that is proportional to the force estimate. Due to the different force estimate algorithms used, and due to thermal drift, the Stream 1 and Stream 2 may disagree. For example, Stream 2 may report "force=0", while Stream 1 reports "force detected". When the streams disagree, no change in force state is recorded for the input device, thereby compensating for a false negative in reporting a force change. The false negative may arise from thermal drift in the resistance measurements. Note that the streams will merge (agree) once a finger is lifted.

Figure 10:
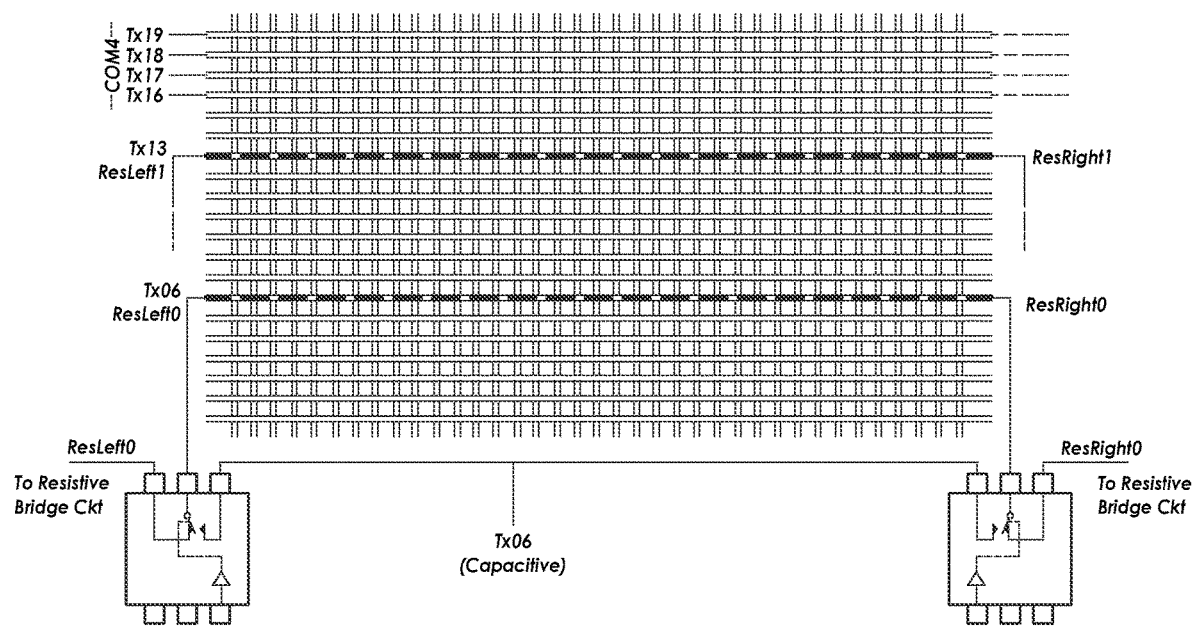
FIG. 10 shows a system diagram in accordance with disclosed embodiments.

FIG. 10 shows an example device for implementing one or more embodiments. In FIG. 1, an example of a bars and stripes two-layer electrode pattern used for 2D capacitive touch sensing is shown. The devices shown in both FIG. 10 and FIG. 1 are examples of input devices used with respect to the techniques described in FIG. 2 through FIG. 9, as well as FIG. 12 through FIG. 15.

For the device shown in FIG. 10, the routing traces may be dynamically altered via analog switches (shown) to isolate one or more of the ITO electrodes. In this example, two electrodes, Tx6 and Tx13 have been isolated. These electrodes were selected for having good strain response for a finger pressing anywhere on the screen. Other electrodes may be selected without departing from the scope of the claims. The selected electrodes are located at about one-third and two-thirds from the bottom. The locations selected may normalize spatial response. For example pressing in center of screen, Tx6 and Tx13 respond about the same. Tx10 would have higher response, but center response is already high—this placement give better response for fingers near the edges. The edge glass doesn't bend much, but pressing near the edge bend glass towards the center, so that's the best region to be sensing for strain.

In the example, two analog switches are shown for Tx06. Likewise, Tx13 may have two analog switches for dynamic isolation. Bezel routing area can also grow if the panel is not already double routed. For a single-routed panel one added trace is required for each electrode sensed. The approach can be extended to the other axis where likewise, routing count should be minimized.

FIG. 10 may also illustrate simultaneous sensing of capacitance and resistance. In the example, electrodes Tx16 thru Tx19 are driven with a CDM4 waveform. Concurrently or simultaneously, the resistance of electrodes Tx13 and Tx06 can be measured. Thus, using the capacitive measurements, touch location may be determined, and using the resistance measurements, a force may be determined.

Figure 11:
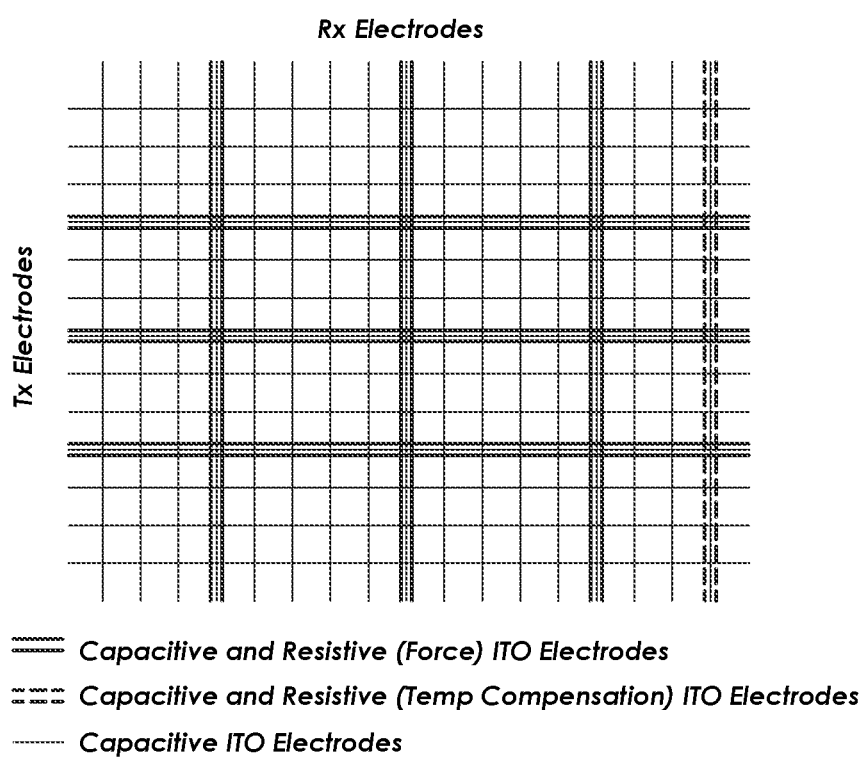
FIG. 11 shows a system diagram in accordance with disclosed embodiments.

FIG. 11 illustrates the same idea as FIG. 10 applied to two axes, with three force sensors on each axis. In this configuration, it is possible to estimate 2D finger location for one finger (underwater application), or estimate force for two fingers, assuming the finger locations are known from the 2D capacitive image. The estimate is computed using interpolation, and may have factory calibration.

Figure 12:
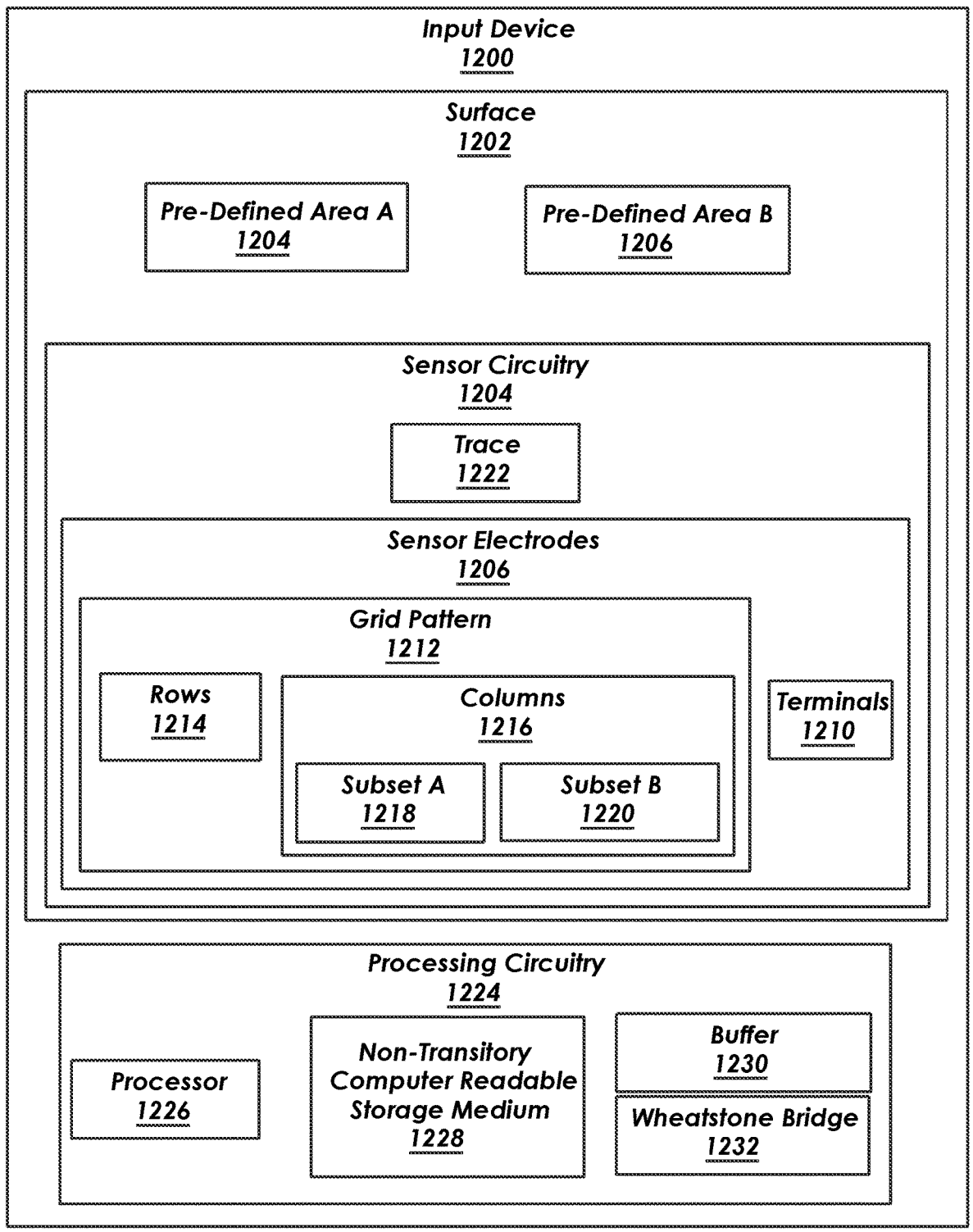
FIG. 12 shows a system diagram in accordance with one or more embodiments.

FIG. 12 shows a system diagram in accordance with one or more embodiments. Input device (1200) may be an example of input device (100) of FIG. 1, or of any of the input devices shown in FIG. 4, FIG. 5, FIG. 10, and FIG. 11. Input device (1200) may be used to implement any of the techniques described with respect to FIG. 1 through FIG. 11, as well as the methods of FIG. 13 through FIG. 15.

Input device (1200) includes surface (1202). Sensor circuitry (1204), including sensor electrodes (1206), are disposed in, on, or underneath the surface (1202). In this manner, the surface (1202) may be a sensing region, such as sensing region (120) of FIG. 1.

The surface (1202) may include pre-defined areas, such as pre-defined area A (1208) and pre-defined area B (1210) that are estimated touch locations. An estimated touch location is an area on the surface (1202) where touching by a user is expected. For example, the input device (1200) could be a mobile phone with virtual buttons displayed on the display device, and the user will interact with the input device by touching the pre-defined areas of the surface (1202) where the virtual buttons are displayed. In this example, the virtual buttons are pre-defined areas which are estimated touch locations on the input device (1200).

Terminals (1212) of the sensor electrodes (1206) may be disposed at various locations within the area of the surface (1202). For example, the terminals may be disposed on an edge of the input device (1202), or may be disposed in pre-selected areas within the area defining the surface (1202).

The sensor electrodes (1206) may take the form of wires or conductive lines arranged in a grid pattern (1214) of rows (1216) and columns (1218). This arrangement is shown in FIG. 4, FIG. 5, FIG. 10, and FIG. 11. In an embodiment, groups of the columns (1218) or possibly the rows (1216) of electrodes may be arranged in subsets, such as subset A (1220) and subset B (1222). The subsets of electrodes are organized for purposes of data collection, as described with respect to FIG. 13 through FIG. 15. The subsets of electrodes may be disposed outside of a pre-defined area of estimated touch locations on the surface of the input device (1200).

The subsets of electrodes include terminals on a single shared edge of the surface. In this case, the subsets of electrodes may be shorted with a second subset of electrodes adjacent the pre-defined area.

The subsets of electrodes may be near a center of the surface. A trace (1224) may connect one side of some of the subsets of electrodes. A "trace" is a wire or conductive line which is included in addition to the sensor electrodes (1206). The trace (1224) has a resistance greater than that of the subsets of electrodes. Thus, the trace (1224) increases a sensitivity to changes to resistance in the subset of electrodes caused by the force applied to the surface. The increase in sensitivity is relative to changes in resistance caused by temperature.

In an embodiment, the trace (1224) connects only one side of a subset of the sensor electrodes (1206). While a trace (1224) may be the same or different type of material as the sensor electrodes (1206), the design purpose of the trace (1224) within the design of the sensor circuitry (1204) is different than the design purpose of the sensor electrodes (1206). The use, and hence design purpose, of the trace (1224) is described with respect to FIG. 13 through FIG. 15.

The input device (1200) may also include processing circuitry (1226) in electrical communication with the sensor circuitry (1204). The processing circuitry (1226) is configured to execute one or more data collection and processing functions, as described with respect to FIG. 13 through FIG. 15. In one or more embodiments, the executable functions of the processing circuitry (1226) may be partially or fully replaced by execution by a processor (1228) of software stored on a non-transitory computer readable storage medium (1230).

The processing circuitry (1226) may also include a buffer (1232). The buffer (1232) is circuitry which is configured to temporarily store data from a data stream. Over time, new data received in the buffer (1232) may overwrite older data in the buffer (1232). Operation of the buffer (1232) is described with respect to FIG. 13 through FIG. 15.

The processing circuitry (1226) may also include a Wheatstone bridge (1234). In electronics, generally, a Wheatstone bridge is an electrical circuit used to measure an unknown electrical resistance by balancing two legs of a bridge circuit, one leg of which includes the unknown component. Each leg of the bridge circuit may include one or more resistors. Operation of the Wheatstone bridge (1234) is described further with respect to FIG. 13 through FIG. 15.

Figure 13:
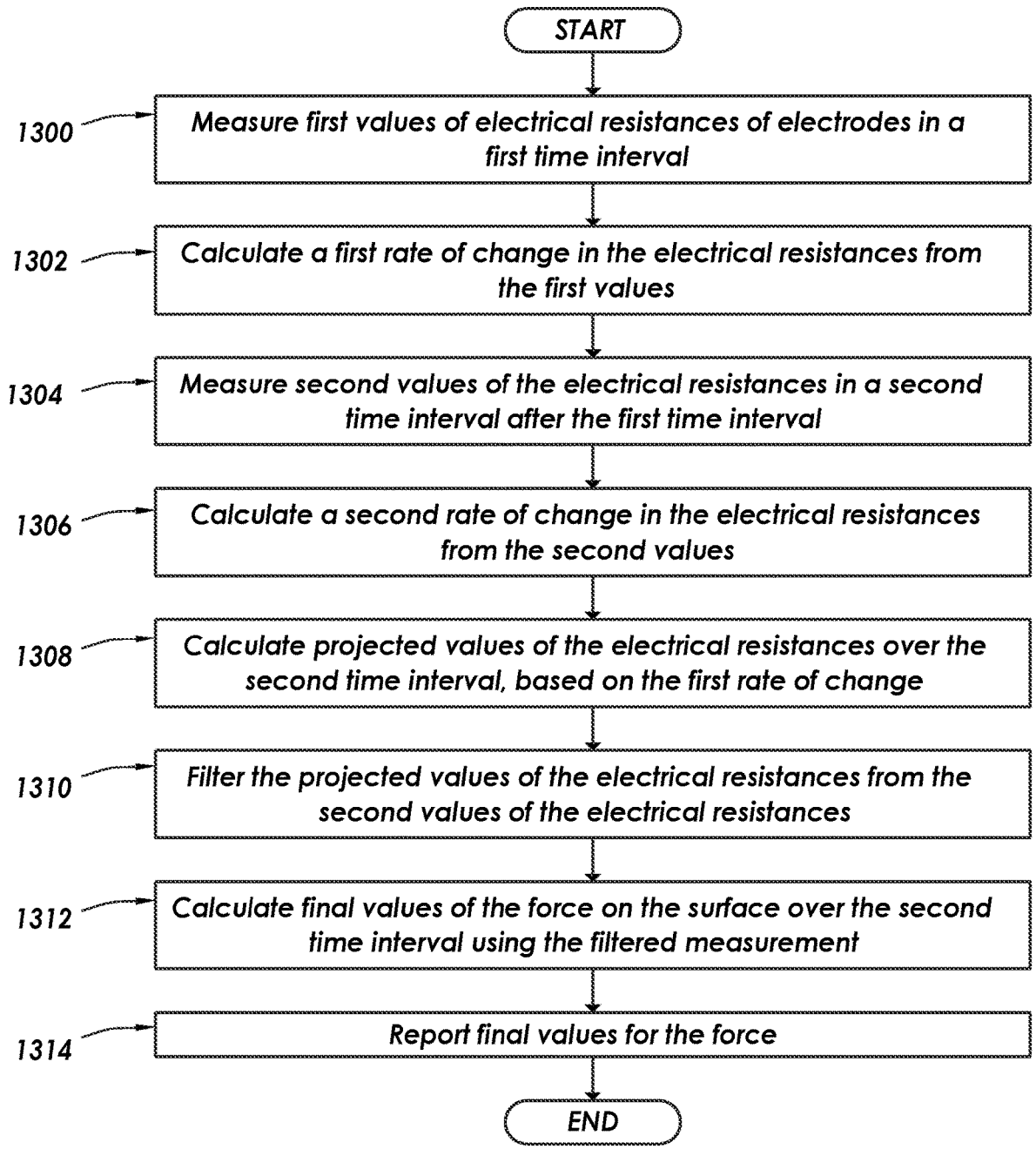
FIG. 13 shows a flowchart of a method in accordance with one or more embodiments.
Figure 14:
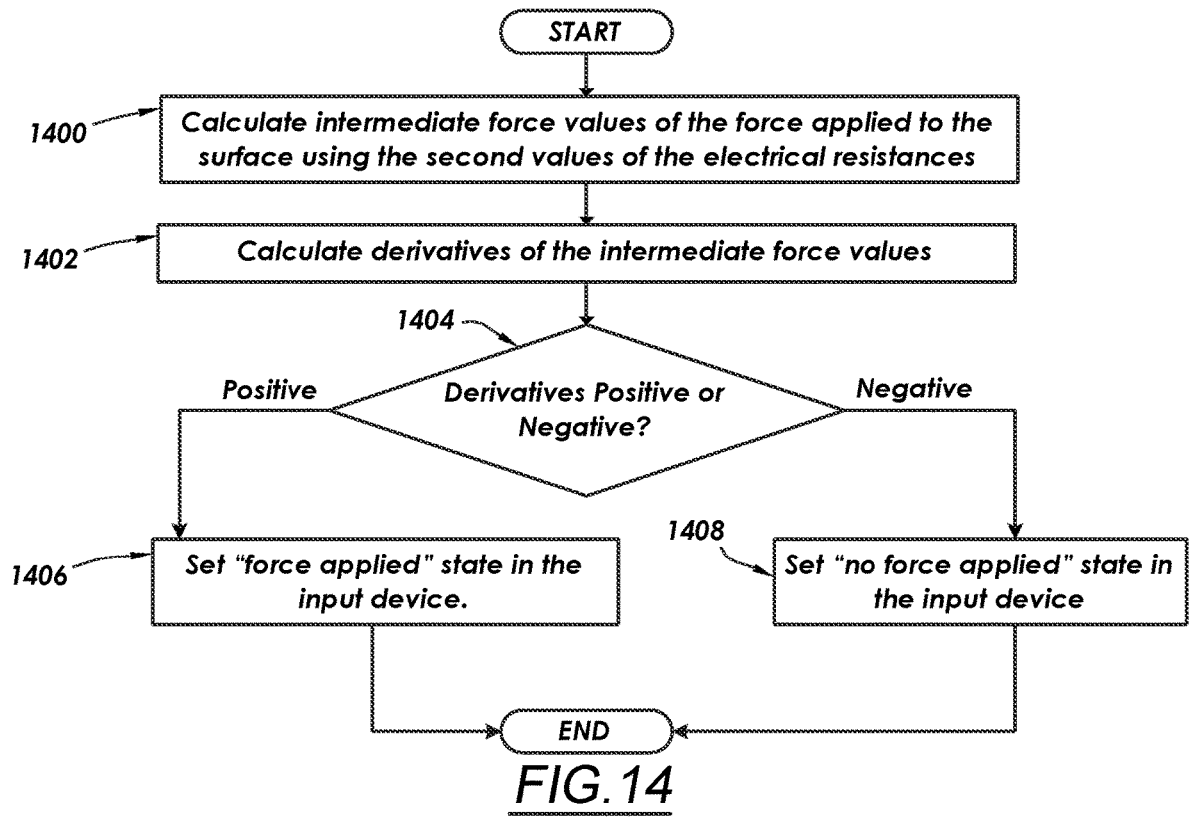
FIG. 14 shows a flowchart of a method in accordance with one or more embodiments.
Figure 15:
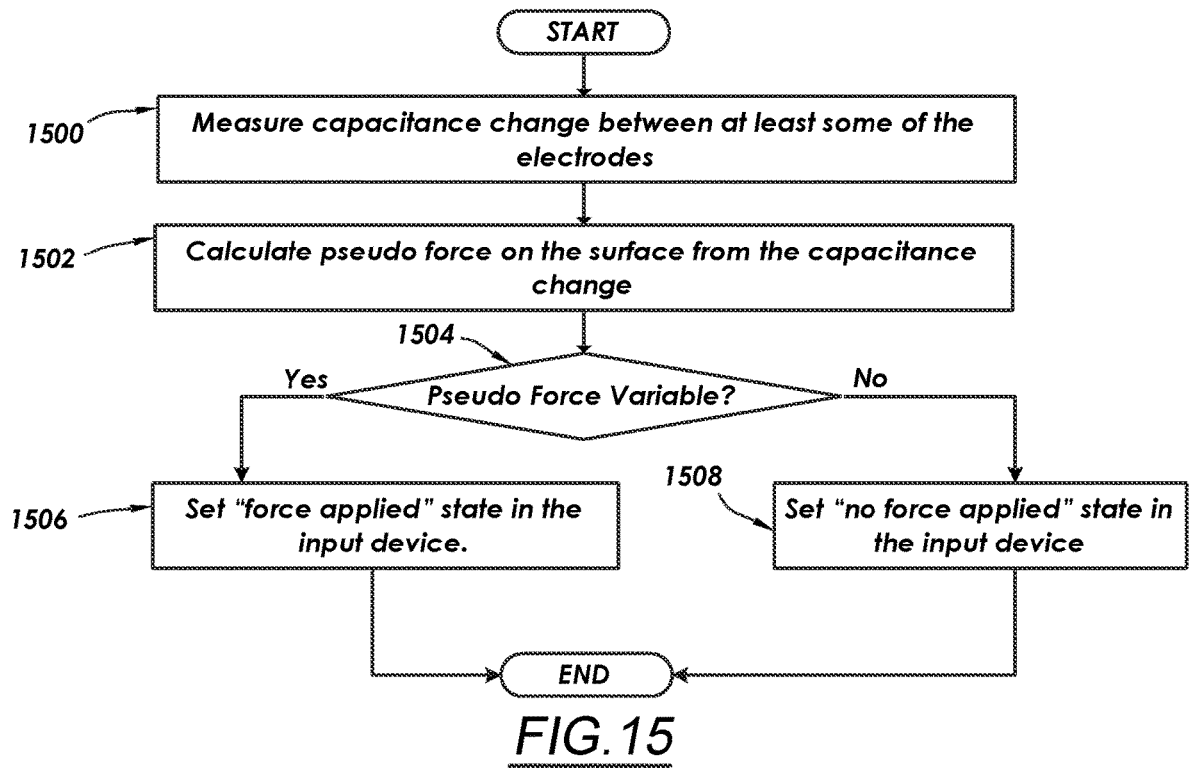
FIG. 15 shows a flowchart of a method in accordance with one or more embodiments.

FIG. 13 through FIG. 15 show flowcharts of methods in accordance with one or more embodiments. The methods shown in FIG. 13 through FIG. 15 may be used, with respect to measuring a force on a surface, to account for an electrical resistance change in electrodes caused by a temperature change, relative to an electrical resistance change in electrodes caused by application of a force to the surface. The term "account for" includes different techniques for preventing the resistance change due to the temperature change from unduly affecting the force calculation from the total resistance measured. The term "unduly" refers to a pre-selected, quantitative statistical measure of variance from a pre-selected threshold value.

These techniques include the following: filtering the resistance change caused by a temperature change from the total resistance change measured, avoiding finger heat in certain areas on the surface, estimating a screen display heat, computing a derivative of a force signal to identify events, combining a pseudo force determination with a resistance measurement, the conditional use of Wheatstone bridge, and manipulating reporting of the total force based on multiple force calculation method. In one or more embodiments, the techniques may be used individually, or in different combinations with each other.

These techniques are also described with respect to FIG. 2 through FIG. 11.

The method described with respect to FIG. 13 may be implemented using an input device, such as input device 100 of FIG. 1, and one or more of the input devices shown in FIG. 3, FIG. 4, FIG. 5, and FIG. 12. The steps described with respect to FIG. 13 may be performed by processing circuitry, by a processor executing software, or by a combination thereof. FIG. 13, in particular, relates to the filtering method described above.

At step 1300, first values of electrical resistances of electrodes are measured by a processor or processing circuitry. The electrical resistances vary with temperature and also vary with a pressure applied to a surface of the input device. At step 1302, a first rate of change in the electrical resistances is calculated from the first values. The calculation may be performed by a processor or processing circuitry.

Then, at step 1304, second values of the electrical resistances are measured, using a processor or processing circuitry, in a second time interval after the first time interval. At step 1306, a second rate of change in the electrical resistances are calculated from the second values by a processor or processing circuitry. The second rate of change is larger than the first rate of change. A larger rate of change is expected when a touching event occurs on the surface.

At step 1308, projected values of the electrical resistances are calculated by a processor or processing circuitry over the second time interval, based on the first rate of change. In other words, a projection is made regarding what the electrical resistances would have been in the second time interval, had the first rate of change in electrical resistances continued to increase at the same rate as what was observed or calculated in the first time interval. This projection indicates the estimated amount of resistance change that is caused by the temperature change during the second time interval. Thus, the first rate of change may be characterized as a steady state drift in the electrical resistances caused by the change in temperature.

At step 1310, responsive to detecting the second rate of change, the projected values of the electrical resistances are filtered by a processor or processing circuitry from the second values of the electrical resistances. In this manner, a filtered measurement of the electrical resistances is established. In other words, when detecting a larger rate of change of resistances, an assumption is made that a touch event is occurring. The projected resistance changes caused by temperature are then filtered from the total resistances measured. The term "filtering" may include simple subtraction of values, or any convenient statistical filtering method.

At step 1312, final values for the force on the surface are calculated by a processor or processing circuitry over the second time interval using the filtered measurement. Then, at step 1314, the final values for the force are reported by a processor or processing circuitry. The method of FIG. 13 may terminate thereafter.

The term "reported" means that the values in question are provided electronically to some other processing circuitry or a processor for performing functions on the input device. For example, the final values for the force may be reported to a processor of the input device, which then uses the final values of the force to change a function of the input device. More specifically, such as when the final values of the force exceed a threshold, the processor may instruct the display screen to be updated in a manner consistent with the user's touch. In this manner, the user perceives that a command to the input device has been processed when the user's finger touches an area on the surface of the input device.

The method of FIG. 13 may be varied. For example, measurements for the first time interval may be stored in a buffer. The buffer has sufficient memory to store the measurements over a pre-defined time prior to an onset of the second time interval.

In another example, such as with respect to the input device shown in FIG. 3, sensing the onset of the force may be performed only in a pre-defined area (e.g., avoiding finger heat in certain areas on the surface). Specifically, the pre-defined are may be defined by the columns of electrodes shown by the hashed lines in FIG. 3. In this case, the measuring of electrical resistances in both the first time interval and the second time interval may be performed only for the subset of columns of electrodes shown. Similarly, sensing of electrodes in the pre-defined areas where touching is expected may be avoided.

The method shown in FIG. 13 may be combined with other techniques, such as correlating a derivative of the total force measurement with the resistance-based force calculation. Use of the derivative of the force in this manner is shown with respect to FIG. 14. FIG. 14 therefore may be considered an extension of FIG. 13; however, in other embodiments, the method of FIG. 14 may stand by itself or in combination with other techniques disclosed herein.

Thus, at step 1400, intermediate force values for the force applied to the surface are calculated by a processor or processing circuitry using the second values of the electrical resistances. Then, at step 1402, derivatives of the intermediate force values are calculated by a processor or processing circuitry.

At step 1404, a determination is then made whether the derivatives are positive or negative. If the derivatives are positive at step 1404, then at step 1406 a "force applied" state is set by a processor or processing circuitry in the input device. Otherwise, if the derivatives are negative at step 1406, then at step 1408 a "no force applied" state is applied in the input device. The method of FIG. 14 may terminate thereafter.

The methods shown in FIG. 13 or FIG. 14 may be combined with still other techniques, such as correlating a calculated pseudo force with the resistance-based force calculation. Use of the pseudo force in this manner is shown with respect to FIG. 15. FIG. 15 therefore may be considered an extension of FIG. 13 and/or FIG. 14; however, in other embodiments, the method of FIG. 15 may stand by itself or in combination with other techniques disclosed herein.

At step 1500, a capacitance change is measured by a processor or processing circuitry between at least some of the electrodes. Then, at step 1502, a pseudo force is calculated on the surface from the capacitance change. The calculation may be performed by a processor or processing circuitry.

At step 1504, a determination is then made by a processor or processing circuitry whether the pseudo force is variable over a time interval. The time interval may be within the second time interval mentioned with respect to FIG. 13. If the pseudo force is variable (a "yes" determination at step 1504), then at step 1506 (regardless of any prior evaluations of the force) a "force applied" state is applied in the input device by a processor or processing circuitry. If the pseudo force is not variable (a "no" determination at step 1504), then at step 1508 (regardless of any prior evaluations of the force) a "no force applied" state is applied in the input device by a processor or processing circuitry. The method of FIG. 15 may terminate thereafter.

The method of FIG. 15 may be further varied. For example, assume the rate of change of resistances indicates a "pressure applied" event (such as when the second rate of change exceeds the expected resistance change due to temperature as explained in FIG. 13). In this case, if the rate of change exceeds a threshold (i.e., is too large), then the force determination may be overridden by a processor or processing circuitry. Such an event may occur when a stylus or other small implement is used to manipulate the input device. In this case, only the pseudo force may be calculated and then reported as being the force applied to the device.

The methods described with respect to FIG. 13 through FIG. 15 may be varied still further. For example, for any of these methods, a two-resistor Wheatstone bridge or four-resistor Wheatstone bridge may be used to determine a portion of a total change in resistance values for the electrodes that corresponds to the change in temperature. Because a Wheatstone bridge allows for the determination of an unknown resistance, and because the Wheatstone bridge is also subjected to the temperature change, the total change in resistance on account of the change in temperature may be isolated. In this case, the portion of the change to electrical resistance caused by the temperature change may be subtracted or otherwise filtered from the total change in electrical resistance measured in the electrodes. This filtering may be performed by a processor or processing circuitry. The force applied to the input device may then be calculated by a processor or processing circuitry using the resulting filtered measurement of change in electrical resistance.

In still another example, two or more force reporting streams may be calculated by a processor or processing circuitry. Specifically, two or more of the methods for calculating force may be used simultaneously in the input device. Each method creates a separate recommendation for "force applied" and "no force applied". Once both methods agree that no force is applied or that force is applied, then one of the force reporting streams (or perhaps a third force reporting stream) may be used by a processor or processing circuitry for the calculated force, accordingly. In this manner, the effect of the change of resistance due to temperature is blunted with respect to the final determination of the force applied to the input device.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A processing system, comprising:
    sensor circuitry configured to, using a plurality of sensor electrodes:
        obtain a plurality of capacitive measurements of a sensing region; and
        obtain a resistance measurement of the sensing region;
    processing circuitry coupled to the sensor circuitry, wherein the processing circuitry is configured to:
        determine a location of an input object using the plurality of capacitive measurements of the sensing region, wherein the location is a first virtual button;
        acquire a resistance measurement using a subset of the plurality of sensor electrodes in a region that excludes the location of the input object, wherein the processing circuitry excludes a first electrode pair that crosses the first virtual button and includes, in the region, a second electrode pair that crosses a second virtual button;
        determine a force value based on the resistance measurement and the location of the input object, wherein determining the force value mitigates a temperature variation of the sensing region affecting the resistance measurement; and
        report the force value.

2. The processing system of claim 1, wherein the processing circuitry is further configured to:
    estimate a rate of change of a temperature from a plurality of resistance measurements acquired over a time interval;
    determine, based on the rate of change of the temperature, an estimated temperature responsive to determining the location of the input object being on the sensing region; and
    determine the force using the estimated temperature and the resistance measurement.

3. The processing system of claim 1, wherein the processing circuitry is further configured to:
    acquire a plurality of resistance measurements over a time interval;
    determine a derivative of the plurality of resistance measurements; and
    determine the force according to a spike in the derivative.

4. An input device, comprising:
    a plurality of sensor electrodes for acquiring a resistance measurement, wherein the plurality of sensor electrodes comprises a first electrode pair and a second electrode pair that are nonoverlapping with a location of an input object and wherein the first electrode pair overlaps a first virtual button and the second electrode pair overlaps a second virtual button, wherein the location is the first virtual button; and
    a processing system coupled to the plurality of sensor electrodes, wherein the processing system is configured to:
        obtain a plurality of capacitive measurements of a sensing region;
        determine a location of an input object using the plurality of capacitive measurements of the sensing region;
        obtain a resistance measurement of the sensing region, wherein the processing system obtains the resistance measurement using the second electrode pair based on the location being the first virtual button;
        determine a force value based on the resistance measurement and the location of the input object, wherein determining the force value mitigates a temperature variation of the sensing region affecting the resistance measurement; and
        report the force value.

* * * * *